(12) United States Patent
Fang et al.

(10) Patent No.: US 8,010,307 B2
(45) Date of Patent: Aug. 30, 2011

(54) IN-LINE OVERLAY MEASUREMENT USING CHARGED PARTICLE BEAM SYSTEM

(75) Inventors: Wei Fang, Milpitas, CA (US); Jack Y. Jau, Los Altos Hills, CA (US); Hong Xiao, Pleasanton, CA (US)

(73) Assignee: Hermes-Microvision, Inc., Hsinchu (TW)

( * ) Notice: Subject to any disclaimer, the term of this patent is extended or adjusted under 35 U.S.C. 154(b) by 93 days.

(21) Appl. No.: 11/951,173

(22) Filed: Dec. 5, 2007

(65) Prior Publication Data

US 2008/0215276 A1 Sep. 4, 2008

Related U.S. Application Data

(60) Provisional application No. 60/869,101, filed on Dec. 7, 2006.

(51) Int. Cl.
*G06F 19/00* (2011.01)
(52) U.S. Cl. ............ 702/95; 702/84; 250/548; 250/221; 250/559.3; 356/401; 356/237.4; 356/237.5
(58) Field of Classification Search .................... 702/95, 702/84; 250/221, 548, 559.3; 356/399–401, 356/237.5, 237.4
See application file for complete search history.

(56) References Cited

U.S. PATENT DOCUMENTS

| | | | |
|---|---|---|---|
| 5,001,076 A * | 3/1991 | Mikkelson .................... 438/174 |
| 5,544,256 A | 8/1996 | Brecher et al. |
| 5,544,264 A | 8/1996 | Bellegarda et al. |
| 5,659,639 A | 8/1997 | Mahoney et al. |
| 5,808,735 A | 9/1998 | Lee et al. |
| 6,246,787 B1 | 6/2001 | Hennessey et al. |
| 6,252,412 B1 | 6/2001 | Talbot et al. |
| 6,292,582 B1 | 9/2001 | Lin et al. |
| 6,526,168 B1 | 2/2003 | Ornes et al. |
| 6,571,005 B1 | 5/2003 | Li et al. |
| 6,690,021 B2 | 2/2004 | Sohn |
| 6,797,955 B1 | 9/2004 | Adler et al. |
| 6,886,153 B1 | 4/2005 | Bevis |
| 6,965,429 B2 | 11/2005 | Honda et al. |
| 7,215,808 B2 | 5/2007 | Miller |
| 2002/0035461 A1 * | 3/2002 | Chang et al. .................... 703/13 |
| 2004/0129900 A1 * | 7/2004 | Den Boef et al. .......... 250/559.3 |

(Continued)

OTHER PUBLICATIONS

Sullivan, Neal T., "The Fundamentals of Overlay Metrology," found at http://www.semiconductor.net/article/CA159008.html?industryid=3030, 4 pages, Sep. 1, 2001.

(Continued)

*Primary Examiner* — Drew A Dunn
*Assistant Examiner* — Hien X Vo
(74) *Attorney, Agent, or Firm* — Sawyer Law Group, P.C.

(57) ABSTRACT

A method and system for controlling an overlay shift on an integrated circuit is disclosed. The method and system comprises utilizing a scanning electron microscope (SEM) to measure the overlay shift between a first mask and a second mask of the circuit after a second mask and comparing the overlay shift to information about the integrated circuit in a database. The method and system includes providing a control mechanism to analyze the overlay shift and feed forward to the fabrication process before a third mask for error correction. A system and method in accordance with the present invention advantageously utilizes a scanning electron microscope (SEM) image overlay measurement after the fabrication process such as etching and chemical mechanical polishing (CMP).

13 Claims, 4 Drawing Sheets

U.S. PATENT DOCUMENTS

2005/0205807 A1    9/2005    Perel et al.
2008/0063265 A1    3/2008    Sathyanarayana

OTHER PUBLICATIONS

Koike, T., et al., "An Investigation of SEM Overlay Metrology," Toshiba Corporation, Yokohama, Japan, 1999, pp. 190-191.

Bishop, Michael et al., "Overlay Metrology Development at International SEMATECH", Jul. 8, 2002, Future FAB International Issue 13—Metrology Analysis, pp. 284-287.

Wolf, et al., "Feature Selection for Unsupervised and Supervised Inference: The Emergency of Sparsity in a Weight-Based Approach", Journal of Machine Learning Research 6, 2005, pp. 1855-1887.

* cited by examiner

IN-LINE OVERLAY MEASUREMENT USING CHARGED PARTICLE BEAM SYSTEM

CROSS REFERENCE TO RELATED APPLICATIONS

Under 35 USC §119, this application is a non-provisional application and claims the benefit of priority to Provisional U.S. Patent Application No. 60/869,101, filed Dec. 7, 2006, entitled "In-Line Overlay Measurement Using Charged Particle Beam System", all of which is incorporated herein by reference.

FIELD OF THE INVENTION

The present invention relates generally to integrated circuits and more specifically to monitoring overlay between masks during integrated circuit manufacturing.

DESCRIPTION OF THE RELATED ART

Overlay measurement is a critical task in semiconductor manufacturing, as yield-efficient production requires precise alignment between layers. In general, a plurality of different images must be formed on a wafer to fabricate the circuit pattern of a semiconductor device. Photolithography is the process used to produce these images on the wafer. In photolithography, pattern images are defined on a plurality of reticles. The pattern images are sequentially transcribed from the reticles onto the wafer, i.e., are overlaid. This overlay step, along with etching, deposition and other processing steps, forms the desired circuit pattern.

A highly precise and densely integrated circuit pattern can be produced only if the different pattern layers forming the circuit pattern are accurately aligned or overlaid relative to one another. Therefore the purpose of the overlay step is to produce a pattern layer that is as precisely aligned as possible with a pre-existing pattern layer.

A tool induced shift (TIS) is an apparent shift of overlay mark due to the asymmetry of metrology optics. Such asymmetry may be caused by problems in the imaging optics, and by illumination asymmetry. The wafer induced shift (WIS) denotes overlay mark asymmetry caused by a process, such as metal deposition or chemical mechanical polishing (CMP). Modern overlay metrology tools achieve the required metrology accuracy by controlling critical asymmetries in the imaging optics, and by compensating for the remaining asymmetries through TIS and WIS calibration. What is desired is a system and method that addresses the above identified issues. The present invention addresses such a need.

SUMMARY OF THE INVENTION

A method and system for controlling an overlay shift on an integrated circuit is disclosed. The method and system comprises utilizing a scanning electron microscope (SEM) to measure the overlay shift between a first mask and a second mask of the circuit after a second mask and comparing the overlay shift to information about the integrated circuit in a database. The method and system includes providing a control mechanism to analyze the overlay shift and feed forward to the fabrication process before a third mask for error correction.

A system and method in accordance with the present invention advantageously utilizes a scanning electron microscope (SEM) image overlay measurement after the fabrication process such as etching and chemical mechanical polishing (CMP). By utilizing a SEM for this overlay measurement the accuracy of the fabrication process is significantly improved and the measurement corrects the tool induced shift (TIS) and wafer induced shift (WIF) generated during the last fabrication

DETAILED DESCRIPTION

The present invention relates generally to integrated circuits and more specifically to monitoring overlay between masks during integrated circuit manufacturing. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Overlay between different photolithograph masks is closely monitored in integrated circuit (IC) manufacturing. Overlay is normally measured by optical systems. Overlay control becomes more challenging for nanometer technology nodes, and monitor overlay with high-resolution charged particle beam microscopes such as a scanning electron microscope (SEM) on a real device could be a possible solution.

Figure 1:
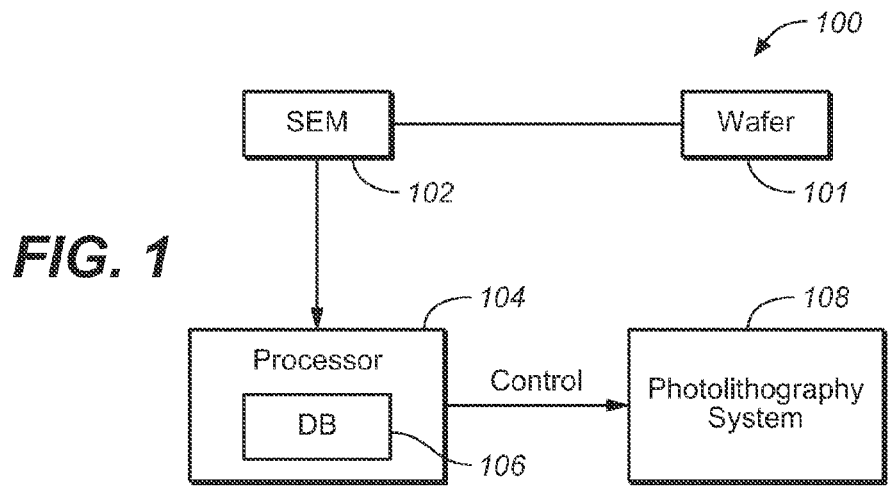
FIG. 1 illustrates a system which can be utilized to measure and control the overlay shift in accordance with the present invention.

A method and system in accordance with the present invention measures and controls overlay shift using an SEM image. FIG. 1 illustrates a system 100 which can be utilized to measure and control the overlay shift in accordance with the present invention. The system 100 includes a SEM 102 which measures the overlay shift of a wafer die 101. The SEM 102 provides measurement information of the overlay shift to a processing system 104. A database 106 within the processing system 104 then utilizes the measurement information to control a photolithography system 108 such that the effect of overlay shift is minimized. This die-to-database approach that takes an SEM image of structures of a certain layout, such as a gate, and comparing it to the design data to determine whether the overlay has been shifted.

Figure 2:
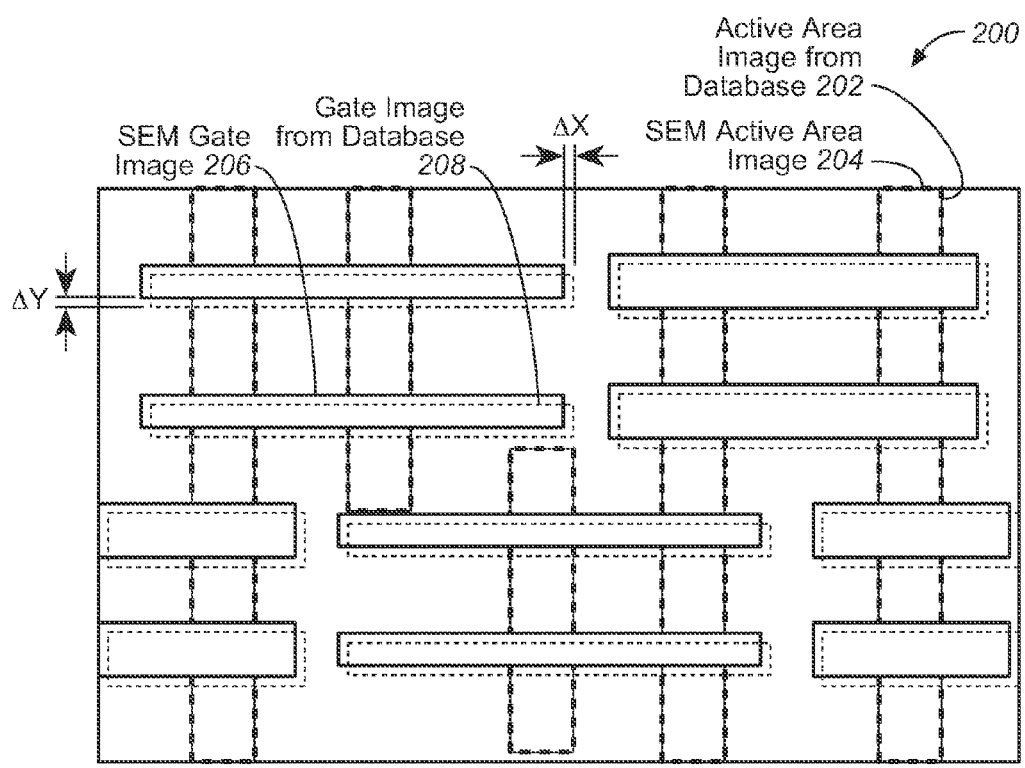
FIG. 2 shows a die-to-database overlay shift measurement algorithm.

FIG. 2 shows a die-to-database overlay shift measurement of a device 200. In FIG. 2, an active area (AA) layout image 202 from the database is aligned with a SEM AA image 204 so that the shift between the SEM gate image 206 from the gate layout image 208 can be calculated and the overlay shift between the gate 208 and the AA layout image 202 can be measured in both x- and y-directions.

Figure 3:
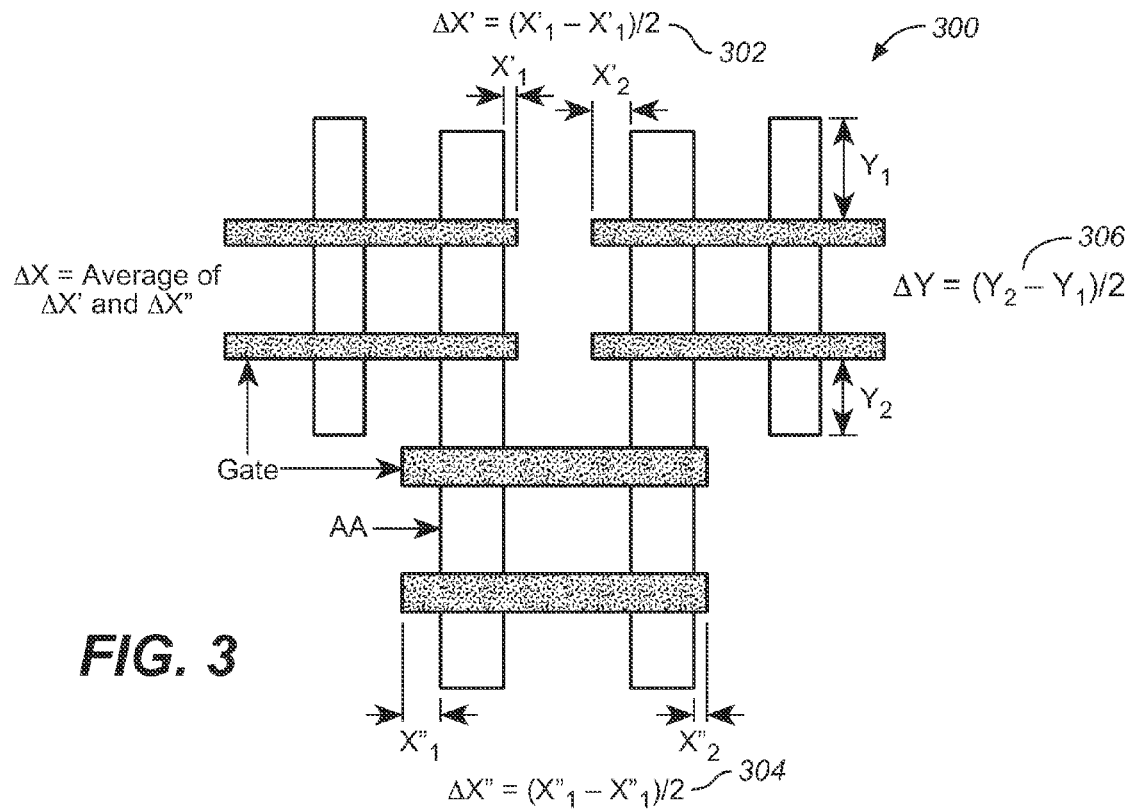
FIG. 3 illustrates a plurality of overlay measurement algorithms based on the amount of asymmetry of a symmetric device structure.

Another approach is measuring the asymmetry of a symmetrically designed device, such as static random access memory (SRAM), from the SEM image. Because the SEM system has large depth of focus, the SEM image can have good resolution of both the top patterns, such as the gate, and the bottom patterns, such as the AA, of an integrated circuit. If the overlay is perfect, the patterns in the SEM image should be perfectly symmetric for a symmetric device, such as SRAM. If the overlay has been misaligned, the pattern becomes asymmetric and the asymmetry is systematic. The direction and amount of misalignment can be measured by pattern match and an average value of asymmetry of symmetric structures. FIG. 3 illustrates a plurality of overlay measurement algorithms 302, 304 and 306 based on the asymmetry of a symmetric device structure. This overlay measurement in a real device structure can be used to verify the optical overlay measurement results in the after development inspection (ADI), which is normally carried out on the scribe line test structures.

Figure 4A:
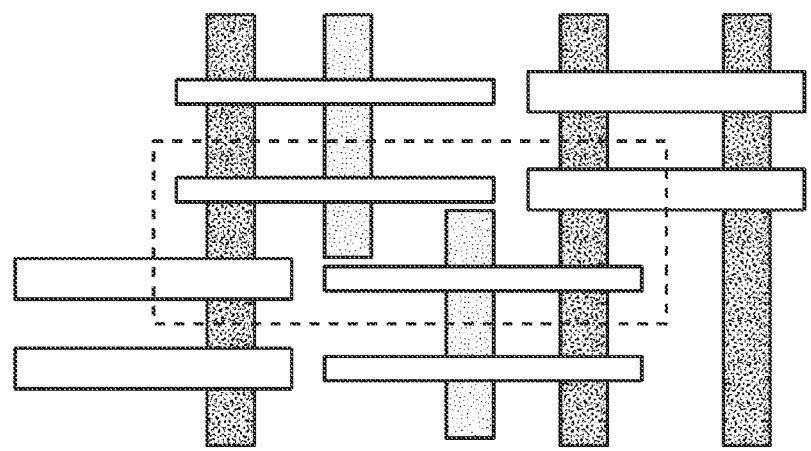
FIG. 4a shows a normal gate to active area (AA) overlay.
Figure 4B:
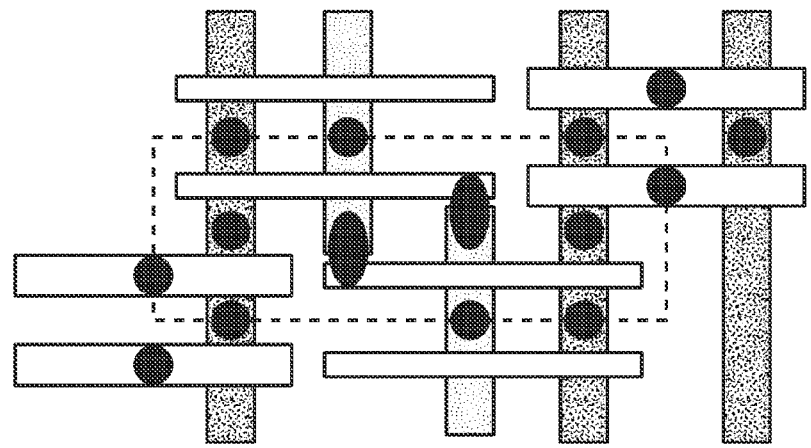
FIG. 4b shows no gate-to-contact short even with striation.
Figure 4C:
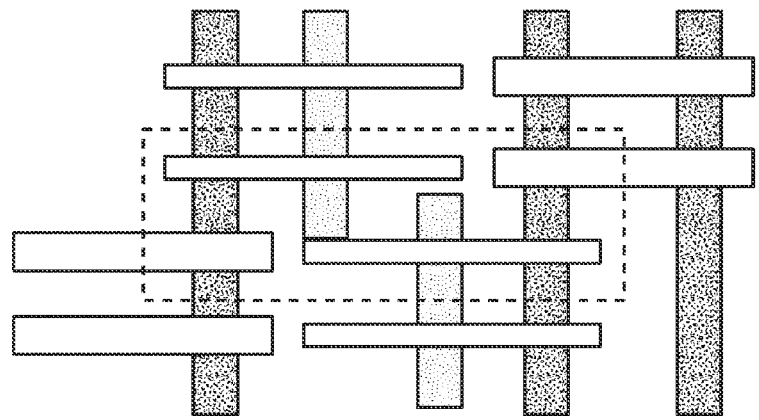
FIG. 4c shows a gate-to-AA overlay shift in the Y-direction.
Figure 4D:
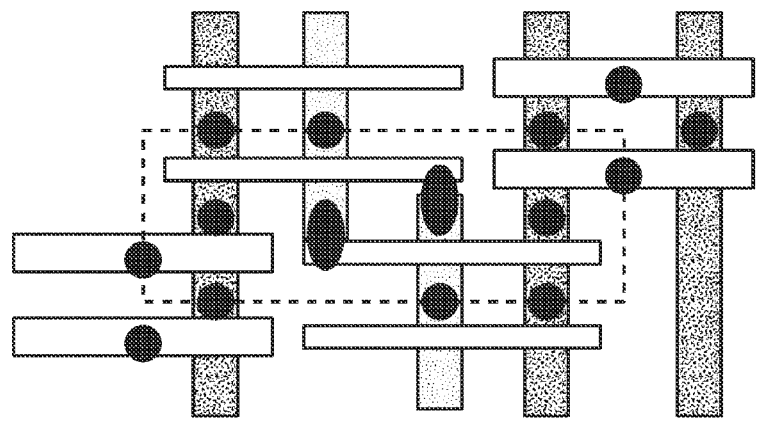
FIG. 4d shows a gate-to-contact short caused by Y-direction overlay shift and striation.
Figure 4E:
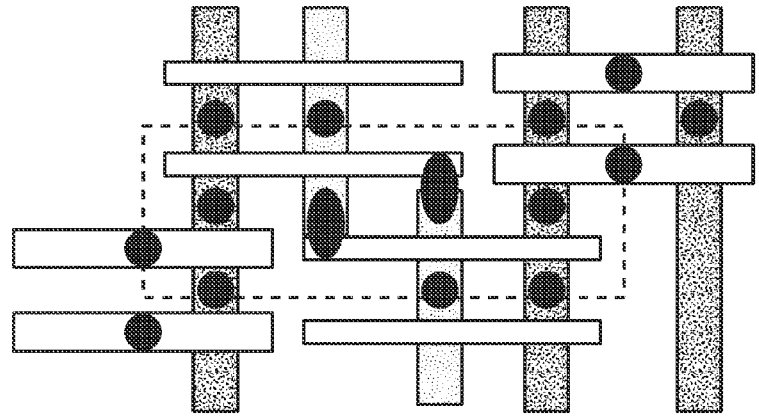
FIG. 4e shows no gate-to-contact short with contact overlay advanced process control (APC) even with Y-direction overlay shift and striation.

The SEM overlay measurement results from a real device can also be used in feed forward process control, or advanced process control (APC). If the overlay shift is found in the gate-to-AA overlay, the amount of misalignment can be fed forward to a contact mask step for adjusting the overlay of that mask and reducing the risk of a contact-to-gate short due to the combined effects of overlay shift and striation, as shown in FIGS. 4a to 4e. FIG. 4a shows a normal gate to AA overlay in an SRAM array. FIG. 4b illustrates no gate to contact short even with striation when gate to AA overlay is normal. FIG. 4c illustrates gate to AA overlay shift in the y-direction. FIG. 4d shows the contact-to-gate short with combined effects gate to AA overlay shift and contact hole striation. In FIG. 4e, there is no contact-to-gate short even with both striation and gate-to-AA overlay shift when the same amount of gate-to-AA overlay shift is applied in contact-to-AA overlay during the contact mask photolithography process through APC.

Figure 5:
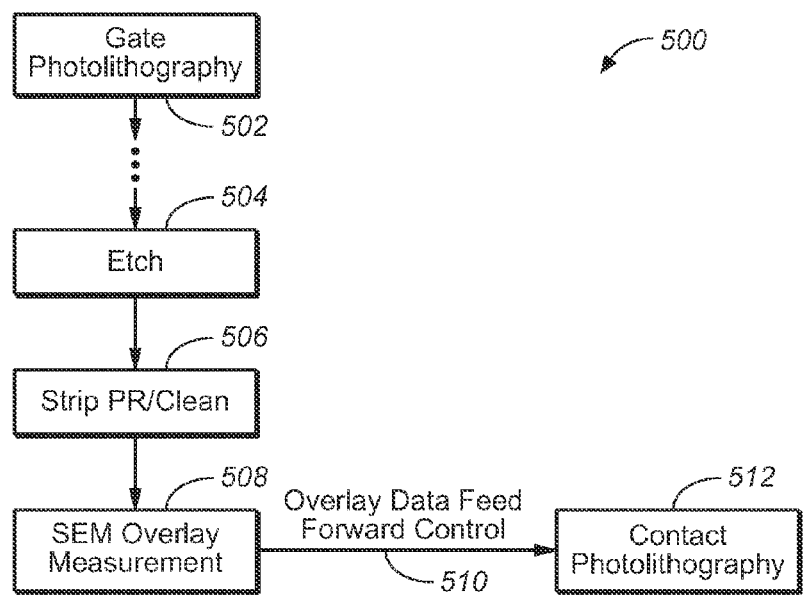
FIG. 5 is a flow chart of an overlay measurement within a photolithography process in accordance with the present invention.

FIG. 5 is a flow chart of an overlay measurement within a photolithography process in accordance with the present invention. Initially, a gate photolithography mask step occurs on the wafer, via step 502. Next, the wafer is etched and cleaned via steps 504 and 506. Thereafter, an overlay measurement is taken by the SEM system, via step 508. The overlay measurement is then fed forward to the contact photolithography process via step 510 to adjust the overlay of the contact photolithography mask 512 to reduce the risk of a contact-to-gate short due to combined effects of y-direction gate-to-AA overlay shift and striation.

A system and method in accordance with the present invention advantageously utilizes a SEM image overlay measurement after the fabrication process such as etching and CMP. By utilizing a SEM for this overlay measurement the accuracy of the fabrication process is significantly improved and the measurement corrects the tool induced shift (TIS) and wafer induced shift (WIF) generated during the last fabrication process.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

We claim:

1. A method for controlling an overlay shift on an integrated circuit, the method comprising:
utilizing an scanning electron microscope (SEM) to measure the overlay shift between a first mask and a second mask of the integrated circuit after the second mask;
comparing the overlay shift to information about the integrated circuit in a database; and
providing a control mechanism to analyze the overlay shift and feed forward to the fabrication process before a third mask to adjust for error correction.

2. The method of claim 1, wherein database contains pattern images of operation steps.

3. The method of claim 1 wherein the database contains an average value of asymmetry of symmetric structure within the integrated circuit.

4. The method of claim 1 wherein the first mask is an active area mask, the second mask is a gate mask, and the third mask is a contact mask.

5. The method of claim 1 wherein the comparing is performed utilizing a plurality of overlay measurement algorithms.

6. The method of claim 4 wherein the contact mask is adjusted to reduce the risk of a contact-to-gate short.

7. A system for controlling an overlay shift on an integrated circuit, the method comprising:
means for utilizing a scanning electron microscope (SEM) to measure the overlay shift between a first and a second mask of the integrated circuit after the second mask;
means for comparing the overlay shift to information about the integrated circuit in a database; and
providing a control mechanism to analyze the overlay shift and feed forward to the fabrication process before a third mask to adjust for error correction.

8. The system of claim 7 wherein database contains pattern images of operation steps.

9. The system of claim 7 wherein the database contains an average value of asymmetry of symmetric structure within the integrated circuit.

10. The system of claim 7 wherein the first mask is an active area mask, the second mask is a gate mask, and the third mask is a contact mask.

11. The system of claim 7 wherein the means for comparing includes a means for utilizing a plurality of overlay measurement algorithms.

12. The system of claim 10 wherein the contact mask is adjusted to reduce the risk of a contact-to-gate short and/or striation.

13. A system for controlling an overlay shift on an integrated circuit, the system comprising:
a scanning electron microscope (SEM) to measure the overlay shift between a first and a second mask of the integrated circuit after a second mask; and
a processing system including a database, wherein the processing system compares the measured overlay shift to overlay shift information within the data base and provides a control mechanism to analyze the overlay shift and feed forward to the fabrication process before a third mask to adjust for error correction.

* * * * *